(12) United States Patent
Nakayama

(10) Patent No.: US 8,342,660 B2
(45) Date of Patent: Jan. 1, 2013

(54) PIEZOELECTRIC ELEMENT, METHOD FOR MANUFACTURING THE SAME, PIEZOELECTRIC ACTUATOR, LIQUID EJECTING HEAD, AND LIQUID EJECTING APPARATUS

(75) Inventor: Masao Nakayama, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 186 days.

(21) Appl. No.: 12/831,089

(22) Filed: Jul. 6, 2010

(65) Prior Publication Data

US 2011/0007114 A1    Jan. 13, 2011

(30) Foreign Application Priority Data

Jul. 8, 2009    (JP) .................................. 2009-161560

(51) Int. Cl.
*B41J 2/045*    (2006.01)
*B21D 53/76*    (2006.01)
(52) U.S. Cl. ........................................ 347/68; 29/890.1
(58) Field of Classification Search .................. None
See application file for complete search history.

(56) References Cited

U.S. PATENT DOCUMENTS

| | | | |
|---|---|---|---|
| 6,351,057 B1 | 2/2002 | Kim | |
| 7,642,695 B2* | 1/2010 | Fujii | 310/320 |
| 7,781,946 B2* | 8/2010 | Izumi et al. | 310/365 |
| 2009/0244206 A1 | 10/2009 | Nakayama | |

FOREIGN PATENT DOCUMENTS

| | | |
|---|---|---|
| CN | 1262529 A | 8/2000 |
| JP | 2005-088411 A | 4/2005 |
| JP | 2009-252757 A | 10/2009 |
| JP | 2010-003971 A | 1/2010 |

* cited by examiner

*Primary Examiner* — Matthew Luu
*Assistant Examiner* — Erica Lin
(74) *Attorney, Agent, or Firm* — Kilpatrick Townsend & Stockton LLP

(57) ABSTRACT

A piezoelectric element includes: a substrate; a lower electrode that is formed on and/or over the substrate; a piezoelectric substance layer that covers the lower electrode; and an upper electrode that is formed on and/or over the piezoelectric substance layer, wherein a side surface of the piezoelectric substance layer includes a first portion that extends from an upper surface of the piezoelectric substance layer and a second portion that extends from the first portion, the first portion is inclined at a first angle with respect to an upper surface of the substrate, the second portion is inclined at a second angle with respect to the upper surface of the substrate, the second angle is smaller than the first angle, and the upper electrode covers at least the first portion and the second portion.

10 Claims, 8 Drawing Sheets

PIEZOELECTRIC ELEMENT, METHOD FOR MANUFACTURING THE SAME, PIEZOELECTRIC ACTUATOR, LIQUID EJECTING HEAD, AND LIQUID EJECTING APPARATUS

This application claims a priority to Japanese Patent Application No. 2009-161560 filed on Jul. 8, 2009 which is hereby expressly incorporated by reference herein in its entirety.

BACKGROUND

1. Technical Field

The present invention relates to a piezoelectric element, a method for manufacturing a piezoelectric element, a piezoelectric actuator, a liquid ejecting head, and a liquid ejecting apparatus.

2. Related Art

A piezoelectric element is a device that has variable shape characteristics. When a voltage is applied thereto, its shape changes. In the structure of a piezoelectric element, a piezoelectric substance layer is sandwiched between electrodes. A piezoelectric element has a wide array of uses. For example, a piezoelectric element is provided in a liquid droplet discharging head of an ink-jet printer. A piezoelectric element is used for various actuators.

A piezoelectric substance layer that constitutes a part of a piezoelectric element is susceptible to external moisture. When affected by moisture, in some cases, the characteristics of the piezoelectric substance layer deteriorate. For ensuring sufficient moisture resistance of a piezoelectric substance layer, for example, a structure in which an upper electrode covers a piezoelectric substance layer has been proposed in the art. An example of such a structure is disclosed in JP-A-2005-88441. However, the related-art structure disclosed in JP-A-2005-88441 has the following disadvantage. Stress may concentrate at a part of an upper electrode (more specifically, at a region of an upper electrode in the neighborhood of a junction where the side surface of a piezoelectric substance layer meets with the upper surface of a substrate (vibrating plate, diaphragm)). As a result, in some cases, the part of the upper electrode where stress concentrates is destroyed, which makes it impossible to ensure sufficient moisture resistance of the piezoelectric substance layer.

SUMMARY

An advantage of some aspects of the invention is to provide a piezoelectric element that makes it possible to relieve the concentration of stress at an upper electrode, thereby offering great reliability. A method for manufacturing such a piezoelectric element is also provided. Another advantage of some aspects of the invention is to provide a piezoelectric actuator that includes such a piezoelectric element, a liquid ejecting head that includes such a piezoelectric actuator, and a liquid ejecting apparatus that includes such a liquid ejecting head.

A piezoelectric element according to a first aspect of the invention includes: a substrate; a lower electrode that is formed on and/or over the substrate; a piezoelectric substance layer that covers the lower electrode; and an upper electrode that is formed on and/or over the piezoelectric substance layer, wherein a side surface of the piezoelectric substance layer includes a first portion that extends from an upper surface of the piezoelectric substance layer and a second portion that extends from the first portion, the first portion is inclined at a first angle with respect to an upper surface of the substrate, the second portion is inclined at a second angle with respect to the upper surface of the substrate, the second angle is smaller than the first angle, and the upper electrode covers at least the first portion and the second portion.

With a piezoelectric element having the above features, it is possible to relieve the concentration of stress at an upper electrode, thereby offering great reliability.

In the recitation of appended claims and description related to the concept of the invention, though not necessarily limited thereto, the term "on and/or over" is used as in, for example, "a certain element, matter, or the like (hereinafter referred to as "B") is formed on and/or over another element, matter, or the like (hereinafter referred to as "A"). In such recitation, description, or the like, the term "on and/or over" encompasses the meaning of a structure in which B is formed directly on A, a structure in which B is formed not directly on A but indirectly over A with still another element, matter, or the like being interposed or sandwiched between A and B, though not limited thereto.

In the structure of a piezoelectric element according to the first aspect of the invention, it is preferable that the shape of each of the first portion and the second portion should be a flat surface.

With a piezoelectric element having the preferred structure, in comparison with a case where the side surface of a piezoelectric substance layer is formed as a curved surface, it is possible to form a piezoelectric substance layer with higher precision and less variation.

In the structure of a piezoelectric element according to the first aspect of the invention, it is preferable that the side surface of the piezoelectric substance layer should further include a third portion that extends from the second portion; the third portion should be inclined at a third angle with respect to the upper surface of the substrate; and the third angle should be larger than the second angle but smaller than the first angle.

With a piezoelectric element having the preferred structure, it is possible to relieve the concentration of stress at an upper electrode without increasing the width of the piezoelectric substance layer (i.e., the size of the piezoelectric substance layer in the direction orthogonal to the direction of the thickness of the substrate) needlessly.

In the structure of a piezoelectric element according to the first aspect of the invention, it is preferable that a plurality of layered structures made up of the lower electrode, the piezoelectric substance layer, and the upper electrode should be formed; the lower electrode should be an individual electrode in each of the plurality of layered structures; and the upper electrode should be a common electrode for the plurality of layered structures.

With a piezoelectric element having the preferred structure, it is possible to relieve the concentration of stress at an upper electrode when the upper electrode is formed as a common electrode, thereby offering great reliability.

A method for manufacturing a piezoelectric element according to a second aspect of the invention includes: forming a lower electrode on and/or over a substrate; forming a piezoelectric substance layer in such a manner that the piezoelectric substance layer covers the lower electrode; forming a first upper electrode on and/or over the piezoelectric substance layer; patterning the first upper electrode and the piezoelectric substance layer; and forming a second upper electrode on and/or over the first upper electrode and the piezoelectric substance layer after the patterning, wherein, in the patterning, a first portion of a side surface of the piezoelectric substance layer that extends from an upper surface of the piezoelectric substance layer and is inclined at a first angle with respect to an upper surface of the substrate and a second portion of the side surface of the piezoelectric substance layer that extends from the first portion and is inclined at a second angle with respect to the upper surface of the substrate are formed, the second angle is smaller than the first angle, and in the formation of the second upper electrode, the second upper electrode is formed to cover at least the first portion and the second portion.

With a method for manufacturing a piezoelectric element having the above features, it is possible to relieve the concentration of stress at an upper electrode, thereby offering great reliability.

A piezoelectric actuator according to a third aspect of the invention includes the piezoelectric element according to the first aspect of the invention, wherein the substrate is flexible and gets deformed due to operation of the piezoelectric substance layer.

With such a piezoelectric actuator, which includes the piezoelectric element having the above features, it is possible to offer great reliability.

A liquid ejecting head according to a fourth aspect of the invention includes: a piezoelectric actuator according to the third aspect of the invention; and a pressure chamber that is in communication with a nozzle hole and has variable capacity that changes due to operation of the piezoelectric actuator.

With such a liquid ejecting head, which includes the piezoelectric actuator having the above features, it is possible to offer great reliability.

A liquid ejecting apparatus according to a fifth aspect of the invention includes a liquid ejecting head according to the fourth aspect of the invention.

With such a liquid ejecting apparatus, which includes the liquid ejecting head having the above features, it is possible to offer great reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

With reference to the accompanying drawings, an exemplary embodiment of the present invention will now be explained in detail.

1. Piezoelectric Element

Figure 1:
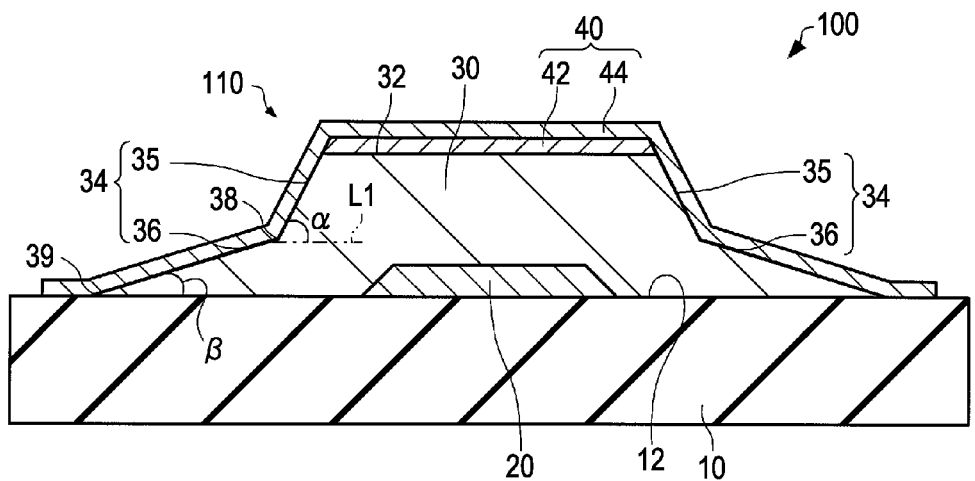
FIG. 1 is a sectional view that schematically illustrates an example of the structure of a piezoelectric element according to an exemplary embodiment of the invention.

A piezoelectric element 100 according to the present embodiment of the invention is described first while referring to a drawing. FIG. 1 is a sectional view that schematically illustrates an example of the structure of the piezoelectric element 100.

As illustrated in FIG. 1, the piezoelectric element 100 includes a substrate 10, a lower electrode 20, a piezoelectric substance layer 30, and an upper electrode 40.

Examples of the material of the substrate 10 include a conductive material, a semiconductor material, and an insulating material. Since the lower electrode 20 is formed on the upper surface 12 of the substrate 10, it is preferable that the superficial layer of the substrate 10 should be made of an insulating material. More specifically, a silicon single crystal substrate can be used as the substrate 10. The substrate 10 may be a flexible vibrating plate (i.e., diaphragm) that gets deformed (deflected) due to the operation of the piezoelectric substance layer 30. In such a configuration, the piezoelectric element 100 serves as a piezoelectric actuator. For example, a silicon single crystal substrate over which silicon oxide ($SiO_2$) and zirconium oxide ($ZrO_2$) are laminated can be used as the substrate 10.

The lower electrode 20 is formed on the substrate 10. Examples of the material of the lower electrode 20 include platinum, iridium, conductive oxide thereof, and lanthanum nickel oxide ($LaNiO_3$: LNO). The lower electrode 20 may have a monolithic structure including any of the above material as a single layer. Alternatively, the lower electrode 20 may have a laminated structure including a plurality of layered materials. The thickness of the lower electrode 20 is, for example, 50 to 300 nm. The lower electrode 20 is one electrode that is provided for applying a voltage to the piezoelectric substance layer 30.

The piezoelectric substance layer 30 covers the lower electrode 20. In the illustrated example, the piezoelectric substance layer 30 covers the upper surface of the lower electrode 20, the side surface of the lower electrode 20, and the upper surface 12 of the substrate 10. A perovskite-type oxide piezoelectric material can be used as the material of the piezoelectric substance layer 30. More specifically, lead zirconate titanate ($Pb(Zr,Ti)O_3$: PZT), lead zirconate titanate niobate ($Pb(Zr,Ti,Nb)O_3$: PZTN), or the like can be used as the material of the piezoelectric substance layer 30. The thickness of the piezoelectric substance layer 30 is, for example, 300 to 3000 nm. The piezoelectric substance layer 30 has an upper surface 32 and a side surface(s) 34. The side surface 34, which extends from the upper surface 32, and the upper surface 32 constitute a continuous surface. In the illustrated example, the upper surface 32 of the piezoelectric substance layer 30 is formed as a flat surface (even surface). The upper surface 32 of the piezoelectric substance layer 30 is parallel to, or substantially parallel to, the upper surface 12 of the substrate 10. The side surface 34 of the piezoelectric substance layer 30 extends from the upper surface 32 thereof to the upper surface 12 of the substrate 10. The side surface 34 includes a first portion 35 and a second portion 36.

The first portion 35 extends from the upper surface 32 of the piezoelectric substance layer 30. The first portion 35 is inclined at a first angle α with respect to the upper surface 12 of the substrate 10. In the example shown in FIG. 1, for the purpose of illustration, the first portion 35 is inclined at the first angle α with respect to a virtual line L1 which a line parallel to the upper surface 12 of the substrate 10. The first angle α is an acute angle. For example, the first angle α is 30° to 70°. The first portion 35 may have, but not limited to, a flat surface (even surface).

The second portion 36 extends from the first portion 35. In the illustrated example, the second portion 36 extends to the upper surface 12 of the substrate 10. In FIG. 1, the second portion 36 is formed as one part of the side surface 34 below the first portion 35, which is the other part of the side surface 34. The second portion 36 is inclined at a second angle β with respect to the upper surface 12 of the substrate 10. The second angle β is smaller than the first angle α. For example, the second angle β is 5° to 20°. The second portion 36 may have, but not limited to, a flat surface (even surface).

Since the side surface 34 of the piezoelectric substance layer 30 includes the first portion 35 and the second portion 36, which have angles of inclination different from each other with respect to the upper surface 12 of the substrate 10, the side surface 34 has a bent 38 formed by the first portion 35 and the second portion 36. That is, the bent 38 is formed at the boundary between the first portion 35 and the second portion 36. For example, the distance from the bent 38 to the upper surface 12 of the substrate 10, which means a film thickness, is approximately one tenth of the distance (i.e., film thickness) from the upper surface 32 of the piezoelectric substance layer 30 to the upper surface 12 of the substrate 10. When the distance from the upper surface 32 of the piezoelectric substance layer 30 to the upper surface 12 of the substrate 10 is approximately 1.2 μm, the distance from the bent 38 to a junction 39 where the side surface 34 of the piezoelectric substance layer 30 meets with the upper surface 12 of the substrate 10 is, for example, approximately 1.3 μm.

The upper electrode 40 is formed on the piezoelectric substance layer 30. The same material as any of those mentioned above as examples of the material of the lower electrode 20 or any combination thereof can be used for the upper electrode 40. The thickness of the upper electrode 40 is, for example, 50 to 300 nm. The upper electrode 40 is the other electrode that is provided for applying a voltage to the piezoelectric substance layer 30. In the illustrated example, the upper electrode 40 includes a first upper electrode 42 and a second upper electrode 44. However, the upper electrode 40 may include the second upper electrode 44 only, though such a modified structure is not illustrated in the drawing.

The first upper electrode 42 covers the upper surface 32 of the piezoelectric substance layer 30. The material of the first upper electrode 42 and the thickness thereof are selected in consideration of the following factors: for example, adhesion to the piezoelectric substance layer 30, diffusion on the piezoelectric substance layer 30, and the like. As a specific example, iridium (thickness: 15 nm) can be used as the material of the first upper electrode 42.

The second upper electrode 44 covers the first upper electrode 42, the first portion 35, and the second portion 36. In the illustrated example, the second upper electrode 44 is formed partially on (i.e., directly on) the upper surface 12 of the substrate 10 and partially over (i.e., not directly on) the upper surface 12 of the substrate 10. The material of the second upper electrode 44 and the thickness thereof are selected in consideration of the following factors: for example, moisture resistance (impermeability), conductivity, and the like. As a specific example, iridium (thickness: 50 nm) can be used as the material of the second upper electrode 44. The lower electrode 20, the piezoelectric substance layer 30, and the upper electrode 40 constitute a layered structure 110.

The piezoelectric element 100 according to the present embodiment of the invention has the following features.

In the structure of the piezoelectric element 100, the side surface 34 of the piezoelectric substance layer 30 includes the first portion 35 and the second portion 36. The first portion 35 is inclined at the first angle α with respect to the upper surface 12 of the substrate 10. The second portion 36 is inclined at the second angle β, which is smaller than the first angle α, with respect to the upper surface 12 of the substrate 10. The side surface 34 of the piezoelectric substance layer 30 (the second portion 36) extends to the upper surface 12 of the substrate 10 to form a junction where the side surface 34 meets with the upper surface 12 with an inclination of the second angle β. Since the piezoelectric element 100 has the above structure, when compared with a structure in which the side surface of a piezoelectric substance layer includes a single portion that is inclined at an angle of α only, it follows that the side surface 34 of the piezoelectric substance layer 30 meets with the upper surface 12 of the substrate 10 with a smaller angle of inclination, which is the second angle β in the present embodiment. With such a structure, it is possible to relieve stress concentration at the upper electrode 40 (the second upper electrode 44). For example, if the side surface of a piezoelectric substance layer were inclined to meet with the upper surface of a substrate with a large angle (for example, in a case where the side surface of a piezoelectric substance layer is approximately perpendicular to the upper surface of a substrate), stress would concentrate at a region of an upper electrode in the neighborhood of a junction (which may be called as an angular region) where the side surface of the piezoelectric substance layer meets with the upper surface of the substrate. In contrast, since the side surface 34 includes the first portion 35 and the second portion 36, the piezoelectric element 100 having the above exemplary structure makes it possible to relieve the concentration of stress at the upper electrode 40 (more specifically, the concentration of stress at a region of the upper electrode 40 in the neighborhood of the junction 39 where the side surface 34 of the piezoelectric substance layer 30 meets with the upper surface 12 of the substrate 10). Therefore, the piezoelectric element 100 offers great reliability.

In addition, in a comparative case where the side surface of a piezoelectric substance layer were inclined to meet with the upper surface of a substrate with a large angle, the adhesion of an upper electrode to the substrate and the piezoelectric substance layer might deteriorate. The coverage of the substrate and the piezoelectric substance layer by the upper electrode might also deteriorate. In contrast, since the side surface 34 of the piezoelectric substance layer 30 meets with the upper surface 12 of the substrate 10 with a smaller angle of inclination, the piezoelectric element 100 having the above exemplary structure makes it possible to improve the adhesion of the upper electrode 40 and the coverage thereby.

Moreover, when compared with a structure in which the side surface of a piezoelectric substance layer includes a single portion that is inclined at an angle of β only, the above exemplary structure of the piezoelectric element 100 has an advantage in that it is possible to make the width of the piezoelectric substance layer 30 smaller. The width herein can be defined as the size of the piezoelectric substance layer 30 in the direction orthogonal to the direction of the thickness of the substrate 10. In short, the piezoelectric element 100 offers an advantage of reduced size.

In the structure of the piezoelectric element 100, each of the first portion 35 and the second portion 36 may have, but not limited to, a flat surface. For example, in a comparative case where the side surface of a piezoelectric substance layer is formed as a curved surface, the formation of the side surface during a manufacturing process will be more difficult. For this reason, it might be hard to form the piezoelectric substance layer with high precision (free from variation). Especially in a case where the side surface of a piezoelectric substance layer is formed as a curved surface by a wet etching method, manufacturing precision is likely to be lower in comparison with a case where the side surface of a piezoelectric substance layer is formed as a flat surface by a dry etching method. Since the piezoelectric element 100 has the above exemplary structure, it is possible to form the piezoelectric substance layer 30 with higher manufacturing precision and less variation.

2. Method for Manufacturing Piezoelectric Element

Next, with reference to drawings, a method for manufacturing the piezoelectric element 100 according to the present embodiment of the invention is explained. Each of FIGS. 2, 3, and 4 is a sectional view that schematically illustrates an example of a step of manufacturing the piezoelectric element 100 according to the present embodiment of the invention.

Figure 2:
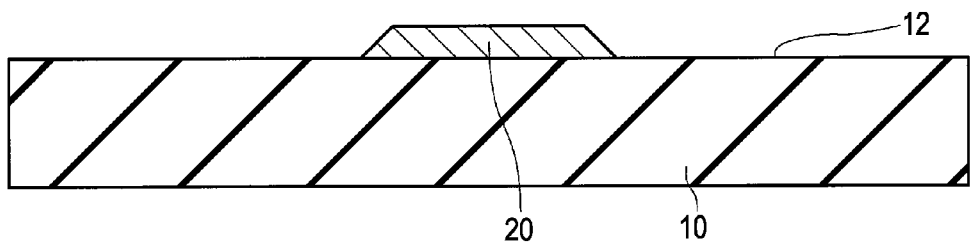
FIG. 2 is a sectional view that schematically illustrates an example of a step of a method for manufacturing a piezoelectric element according to an exemplary embodiment of the invention.

As illustrated in FIG. 2, the lower electrode 20 is formed on the substrate 10. For example, a sputtering method, a plating method, or a vacuum deposition method can be used for the formation of the lower electrode 20. More specifically, an electric conducting layer, which is not illustrated in the drawing, is formed on the substrate 10, followed by the patterning of the electric conducting layer. The lower electrode 20 can be formed on the substrate 10 in this way.

Figure 3:
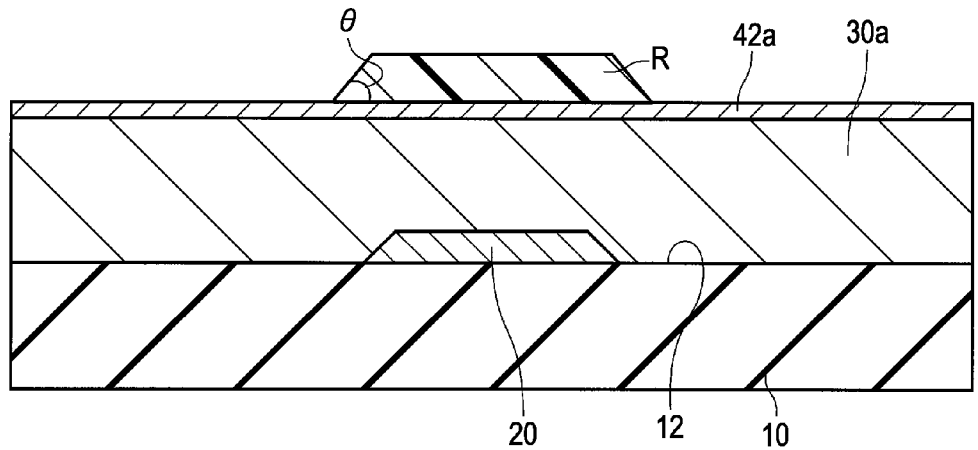
FIG. 3 is a sectional view that schematically illustrates an example of a step of a method for manufacturing a piezoelectric element according to an exemplary embodiment of the invention.
Figure 4:
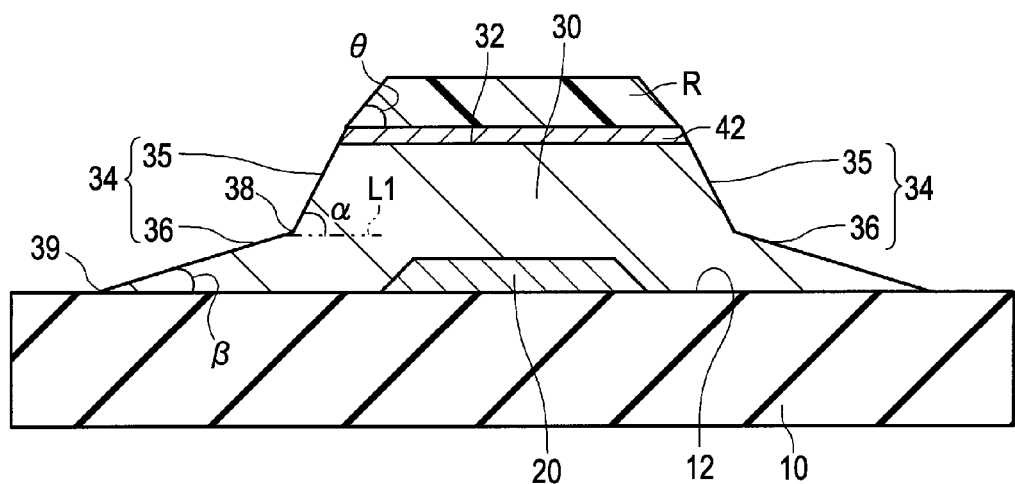
FIG. 4 is a sectional view that schematically illustrates an example of a step of a method for manufacturing a piezoelectric element according to an exemplary embodiment of the invention.

Next, as illustrated in FIG. 3, a piezoelectric substance layer 30a is formed on/over the entire upper surface 12 of the substrate 10 in such a manner that the piezoelectric substance layer 30a covers the lower electrode 20. For example, a sol-gel processing method, a chemical vapor deposition (CVD) method, a metal organic deposition (MOD) method, a sputtering method, or a laser ablation method can be used for the formation of the piezoelectric substance layer 30a. For example, if the material of the piezoelectric substance layer 30a is PZT, the piezoelectric substance layer 30a is subjected to annealing treatment in the presence of oxygen (oxygen atmosphere) at approximately 700 degrees. By this means, it is possible to crystallize the piezoelectric substance layer 30a. Crystallization may be performed after the patterning of the piezoelectric substance layer 30a.

Next, a first upper electrode 42a is formed on the entire surface of the piezoelectric substance layer 30a. For example, a sputtering method, a plating method, or a vacuum deposition method can be used for the formation of the first upper electrode 42a.

Then, a resist R that has a predetermined shape is formed on the first upper electrode 42a. The resist R has a side surface that is inclined at, for example, an angle of θ with respect to the upper surface of the first upper electrode 42a. The degree of the angle θ can be adjusted on the basis of time of light exposure, bake temperature, and the like.

Next, as illustrated in FIG. 4, the first upper electrode 42a and the piezoelectric substance layer 30a are partially etched away while using the resist R as a mask to form the first upper electrode 42 and the piezoelectric substance layer 30, respectively. In other words, the first upper electrode 42a and the piezoelectric substance layer 30a are subjected to patterning. For example, a dry etching method with the use of a high-density plasma device such as inductively coupled plasma (ICP) can be employed for the etching of the first upper electrode 42a and the piezoelectric substance layer 30a. The etching result is good when pressure is set at 1.0 Pa or less in a high-density plasma device (dry etching apparatus). Mixed gas that is made up of chlorine-based gas and argon gas can be used as an example of etchant gas for etching the first upper electrode 42a. Mixed gas that is made up of chlorine-based gas and fluorocarbon gas can be used as an example of etchant gas for etching the piezoelectric substance layer 30a. Examples of chlorine-based gas include $Cl_2$ and $BCl_3$. Examples of fluorocarbon gas include $C_4F_8$ and $CF_4$. As a result of the etching of the piezoelectric substance layer 30a with the use of the above mixed gas, it is possible to form the side surface 34 that includes the first portion 35 and the second portion 36. The reason is explained below.

When the material of the piezoelectric substance layer 30 is PZT, chlorine-based gas is mainly used as an etchant. When etching is performed with the use of the above mixed gas, a great amount of chlorine radical is generated due to the presence of fluorocarbon gas, resulting in highly reactive etching. In such a case, since it makes harder for etchant gas to be supplied to the sidewall of a structure (e.g., the neighborhood of the side surface 34 of the piezoelectric substance layer 30, the neighborhood of the upper surface 12 of the substrate 10, or the like), an etching rate decreases at such a region. It is inferred that the side surface 34 including the first portion 35 and the second portion 36 is formed for the above reason. The degree of the first angle α and the degree of the second angle β can be adjusted on the basis of over-etching amount, the degree of the angle θ of the resist R, and the like.

After the removal of the resist R, the second upper electrode 44 is formed on the first upper electrode 42 and on/over the piezoelectric substance layer 30 as illustrated in FIG. 1. The second upper electrode 44 is formed in such a manner that it covers the first portion 35 and the second portion 36. For example, a sputtering method, a plating method, or a vacuum deposition method can be used for the formation of the second upper electrode 44. More specifically, an electric conducting layer, which is not illustrated in the drawing, is formed on the entire surface, followed by the patterning of the electric conducting layer. The second upper electrode 44 can be formed thereon in this way.

The piezoelectric element 100 can be manufactured through the above steps.

A method for manufacturing the piezoelectric element 100 according to the present embodiment of the invention has the following features.

Since the side surface 34 includes the first portion 35 and the second portion 36 as explained above, a method for manufacturing the piezoelectric element 100 according to the present embodiment of the invention makes it possible to relieve the concentration of stress at the upper electrode 40 (the second upper electrode 44). Therefore, the piezoelectric element 100 manufactured by the above method offers great reliability.

In addition, in the structure of the piezoelectric element 100 manufactured by the above method, the first upper electrode 42 covers the upper surface 32 of the piezoelectric substance layer 30. Therefore, it is possible to protect the upper surface 32 of the piezoelectric substance layer 30 from damage during the process for manufacturing. For example, the upper surface 32 is protected from damage during the etching of the piezoelectric substance layer 30a, during the removal of the resist R, and other steps. Therefore, it is possible to manufacture the piezoelectric element 100 that offers great reliability.

Figure 5:
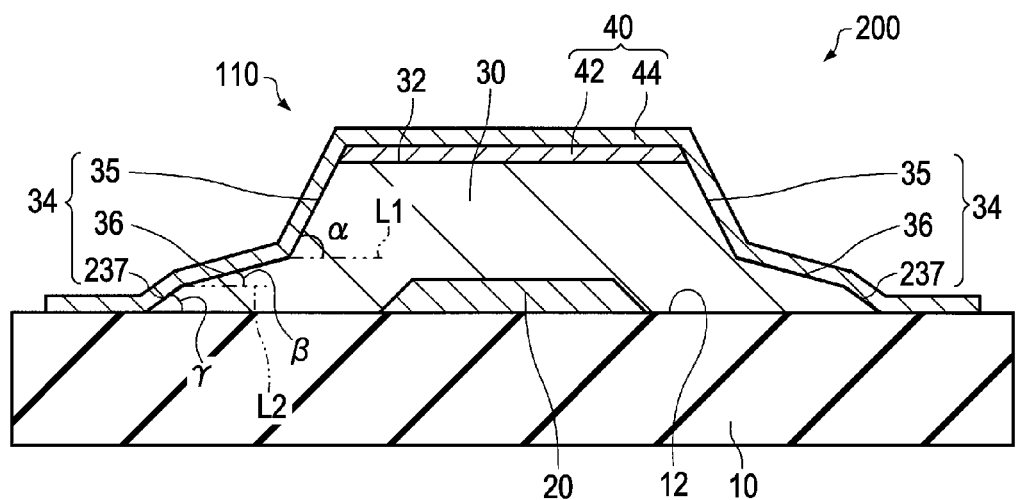
FIG. 5 is a sectional view that schematically illustrates the structure of a piezoelectric element according to a first variation example of an exemplary embodiment of the invention.

3. Variation Examples of Piezoelectric Element (1) Next, with reference to FIG. 5, a piezoelectric element 200 according to a first variation example of an exemplary embodiment of the invention is explained. FIG. 5 is a sectional view that schematically illustrates an example of the structure of the piezoelectric element 200. In the following description of the piezoelectric element 200 according to the first variation example of the invention, the same reference numerals are consistently used for the same components as those of the piezoelectric element 100 according to the foregoing embodiment of the invention so as to omit redundant explanation or simplify explanation.

As illustrated in FIG. 5, in the structure of the piezoelectric element 200, the side surface 34 of the piezoelectric substance layer 30 includes the first portion 35, the second portion 36, and a third portion 237.

The third portion 237 extends from the second portion 36. In the illustrated example, the third portion 237 extends to the upper surface 12 of the substrate 10. The third portion 237 is formed as one part of the side surface 34 below the second portion 36, which is another part of the side surface 34. The third portion 237 is inclined at a third angle $\gamma$ with respect to the upper surface 12 of the substrate 10. The third angle $\gamma$ is larger than the second angle $\beta$ but smaller than the first angle $\alpha$. The third portion 237 may have, but not limited to, a flat surface (even surface). In the example shown in FIG. 5, for the purpose of illustration, the second portion 36 is inclined at the second angle $\beta$ with respect to a virtual line L2, which a line parallel to the upper surface 12 of the substrate 10.

In the structure of the piezoelectric element 200, the side surface 34 of the piezoelectric substance layer 30 includes the first portion 35, the second portion 36, and the third portion 237, which is inclined at the third angle $\gamma$ with respect to the upper surface 12 of the substrate 10. The third angle $\gamma$ is larger than the second angle $\beta$. For this reason, for example, when compared with the structure of the piezoelectric element 100, the above structure of the piezoelectric element 200 has an advantage in that it is possible to make the width of the piezoelectric substance layer 30 (i.e., the size of the piezoelectric substance layer 30 in the direction orthogonal to the direction of the thickness of the substrate 10) smaller. In short, the piezoelectric element 200 offers an advantage of reduced size.

Moreover, in the structure of the piezoelectric element 200, the third angle $\gamma$ is smaller than the first angle $\alpha$. Since the piezoelectric element 200 has the above structure, when compared with a structure in which the side surface of a piezoelectric substance layer includes a single portion that is inclined at an angle of $\alpha$ only, it follows that the side surface 34 of the piezoelectric substance layer 30 meets with the upper surface 12 of the substrate 10 with a smaller angle of inclination. Therefore, it is possible to relieve the concentration of stress at a region of the upper electrode 40 (the second upper electrode 44) in the neighborhood of a junction where the side surface 34 of the piezoelectric substance layer 30 meets with the upper surface 12 of the substrate 10.

Figure 6:
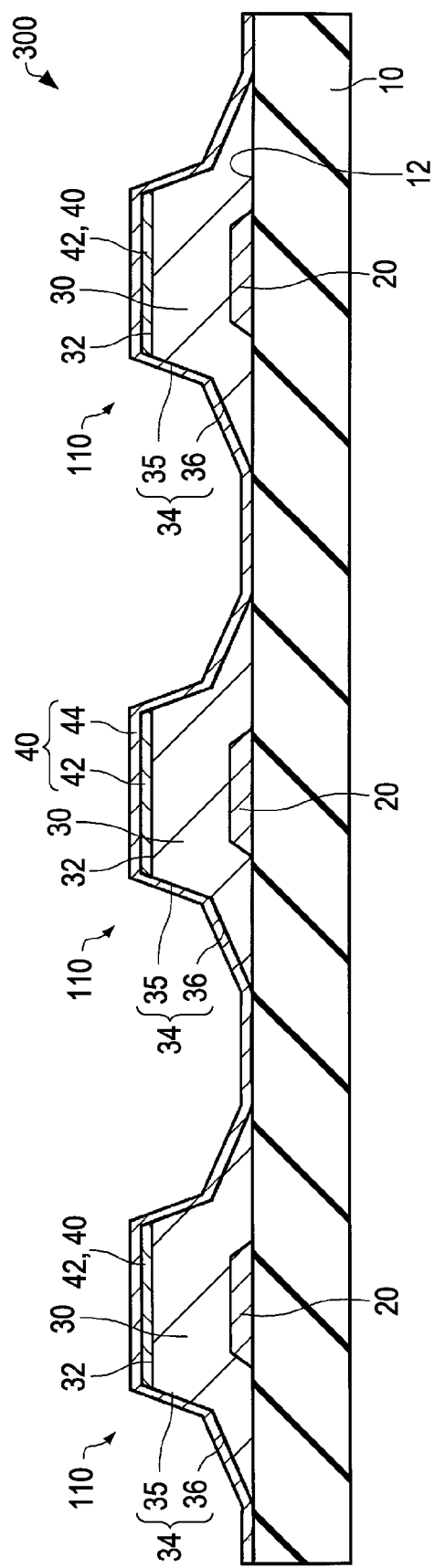
FIG. 6 is a sectional view that schematically illustrates the structure of a piezoelectric element according to a second variation example of an exemplary embodiment of the invention.

(2) Next, with reference to FIG. 6, a piezoelectric element(s) 300 according to a second variation example of an exemplary embodiment of the invention is explained. FIG. 6 is a sectional view that schematically illustrates an example of the structure of the piezoelectric element 300. In the following description of the piezoelectric element 300 according to the second variation example of the invention, the same reference numerals are consistently used for the same components as those of the piezoelectric element 100 according to the foregoing embodiment of the invention so as to omit redundant explanation or simplify explanation.

As illustrated in FIG. 6, the layered structure 110 (which may be called as the laminated body 110) of the piezoelectric element 300 is made up of the lower electrode 20, the piezoelectric substance layer 30, and the upper electrode 40. In this variation example, a plurality of the laminated bodies (layered structures) 110 is formed. Though the number of the laminated bodies 110 is three in the illustrated example, it is not limited thereto. More specifically, in the illustrated example, a plurality of the lower electrodes 20, a plurality of the piezoelectric substance layer portions 30, a plurality of the first upper electrodes 42, and the second upper electrode 44, which is a single electrode, are formed. The second upper electrode 44 can be defined as a common electrode, which is shared by the plurality of laminated bodies 110. In other words, it can be defined that the second upper electrode 44 extends throughout the plurality of laminated bodies 110 as a continuous electrode. The single second upper electrode 44 covers the plurality of first upper electrodes 42, the plurality of piezoelectric substance layer portions 30, and the upper surface 12 of the substrate 10. On the other hand, the plurality of lower electrodes 20 of the plurality of laminated bodies 110 are formed as individual electrodes that are electrically separated from one another.

Since the side surface 34 includes the first portion 35 and the second portion 36, the piezoelectric element 300 makes it possible to relieve the concentration of stress at the upper electrode 40 (the second upper electrode 44) in a structure in which the upper electrode 40 (the second upper electrode 44) is formed as a common electrode. Therefore, the piezoelectric element 300 offers great reliability.

Figure 7:
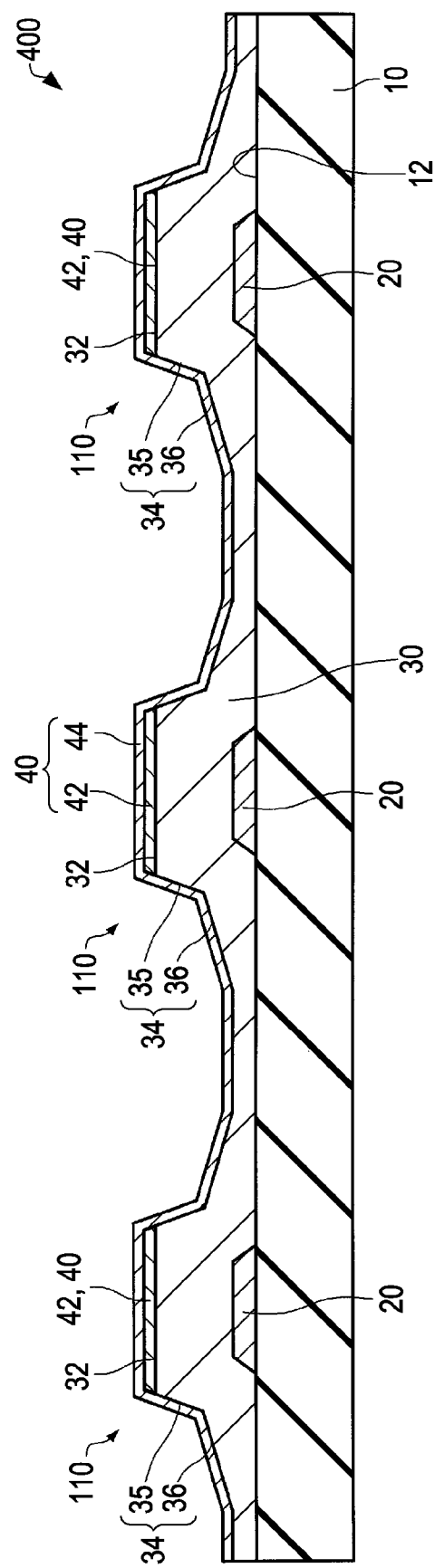
FIG. 7 is a sectional view that schematically illustrates the structure of a piezoelectric element according to a third variation example of an exemplary embodiment of the invention.

(3) Next, with reference to FIG. 7, a piezoelectric element(s) 400 according to a third variation example of an exemplary embodiment of the invention is explained. FIG. 7 is a sectional view that schematically illustrates an example of the structure of the piezoelectric element 400. In the following description of the piezoelectric element 400 according to the third variation example of the invention, the same reference numerals are consistently used for the same components as those of the piezoelectric element 300 according to the second variation example of the invention so as to omit redundant explanation or simplify explanation.

In the structure of the piezoelectric element 300 according to the second variation example of the invention, as explained above, the second upper electrode 44 is formed as a single continuous common electrode that extends throughout the plurality of laminated bodies 110. The structure of the piezoelectric element 400 according to the third variation example of the invention is the same as that of the above piezoelectric element 300 in that the second upper electrode 44 is formed as a single continuous common electrode; however, unlike the above piezoelectric substance layer portions 30, the piezoelectric substance layer 30 of the piezoelectric element 400 illustrated in FIG. 7 is formed as a common piezoelectric substance layer shared by the plurality of laminated bodies 110. More specifically, in the structure of the piezoelectric element 400, the plurality of lower electrodes 20, the piezoelectric substance layer 30, which is a single piezoelectric substance layer, the plurality of first upper electrodes 42, and the second upper electrode 44, which is a single electrode, are formed. In other words, it can be defined that the piezoelectric substance layer 30 extends throughout the plurality of laminated bodies 110 as a continuous layer. The single second upper electrode 44 covers the plurality of first upper electrodes 42 and the single piezoelectric substance layer 30.

In the structure of the piezoelectric element 400, the second upper electrode 44 is not in contact with the substrate 10. Since the second upper electrode 44 is not in contact with the substrate 10, factors that have to be taken into consideration when selecting the material, etc., of the second upper electrode 44 are limited to affinity (e.g., adhesion, reactivity, and the like) to the piezoelectric substance layer 30 (and the first upper electrodes 42). Therefore, it is possible to select the material, etc., of the second upper electrode 44 more freely. Moreover, when a flexible vibrating plate is used as the substrate 10, it is possible to adjust a resonance frequency easily by controlling the remaining amount of the piezoelectric substance layer 30, that is, by controlling the thickness of the film that is in contact with the substrate 10 at the etched region.

Figure 8:
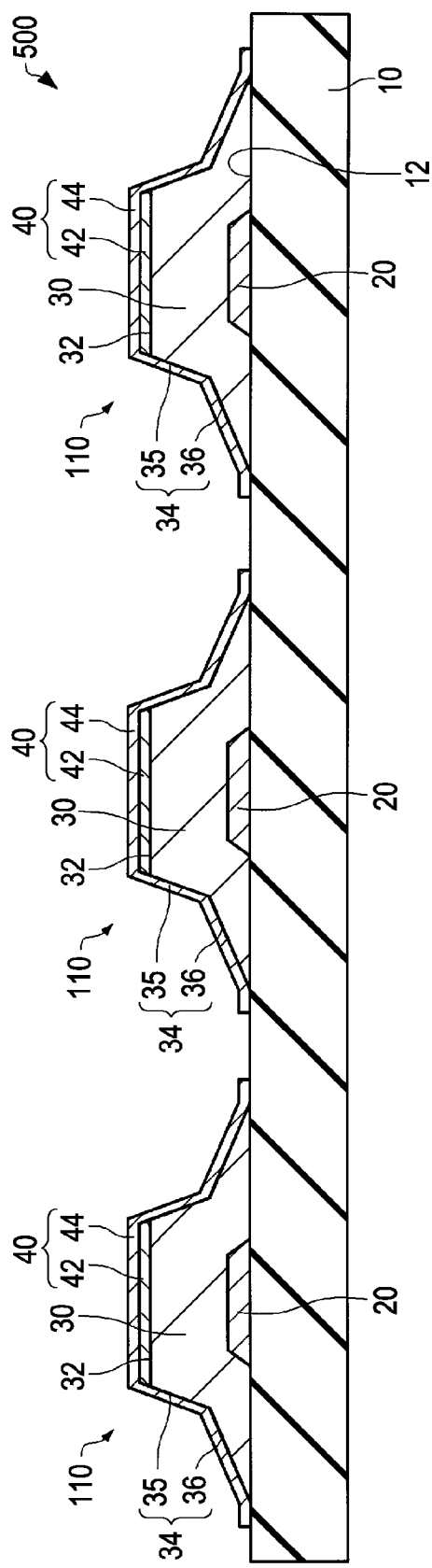
FIG. 8 is a sectional view that schematically illustrates the structure of a piezoelectric element according to a fourth variation example of an exemplary embodiment of the invention.

(4) Next, with reference to FIG. 8, a piezoelectric element(s) 500 according to a fourth variation example of an exemplary embodiment of the invention is explained. FIG. 8 is a sectional view that schematically illustrates an example of the structure of the piezoelectric element 500. In the following description of the piezoelectric element 500 according to the fourth variation example of the invention, the same reference numerals are consistently used for the same components as those of the piezoelectric element 300 according to the second variation example of the invention so as to omit redundant explanation or simplify explanation.

In the structure of the piezoelectric element 300 according to the second variation example of the invention, as explained earlier, the second upper electrode 44 is formed as a single continuous common electrode that extends throughout the plurality of laminated bodies 110. In contrast, in the structure of the piezoelectric element 500, the second upper electrode 44 is formed for each of the plurality of piezoelectric substance layer portions 30 as illustrated in FIG. 8. The second upper electrodes 44 are electrically connected to one another through wiring that is not illustrated in the drawing. By this means, the plurality of second upper electrodes 44 can serve as a common electrode.

When compared with the structures of the piezoelectric elements 300 and 400, the above structure of the piezoelectric element 500 has an advantage in that it is possible to make the influence of the driving of one piezoelectric substance layer portion 30 in two arbitrary laminated bodies 110 that are formed next to each other on the driving of the other piezoelectric substance layer portion 30 in these two laminated bodies 110 (i.e., crosstalk) smaller. Since crosstalk is reduced, the piezoelectric element 500 offers great reliability.

4. Liquid Ejecting Head

Figure 9:
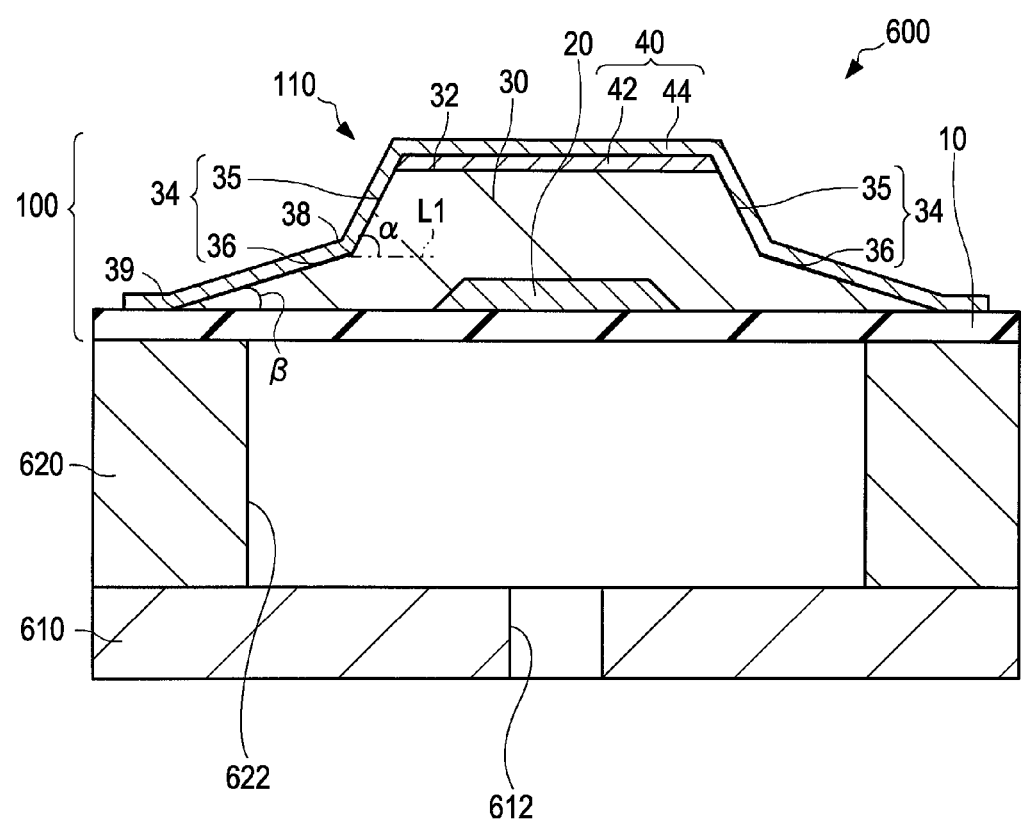
FIG. 9 is a sectional view that schematically illustrates an example of the structure of an essential part of a liquid ejecting head according to an exemplary embodiment of the invention.
Figure 10:
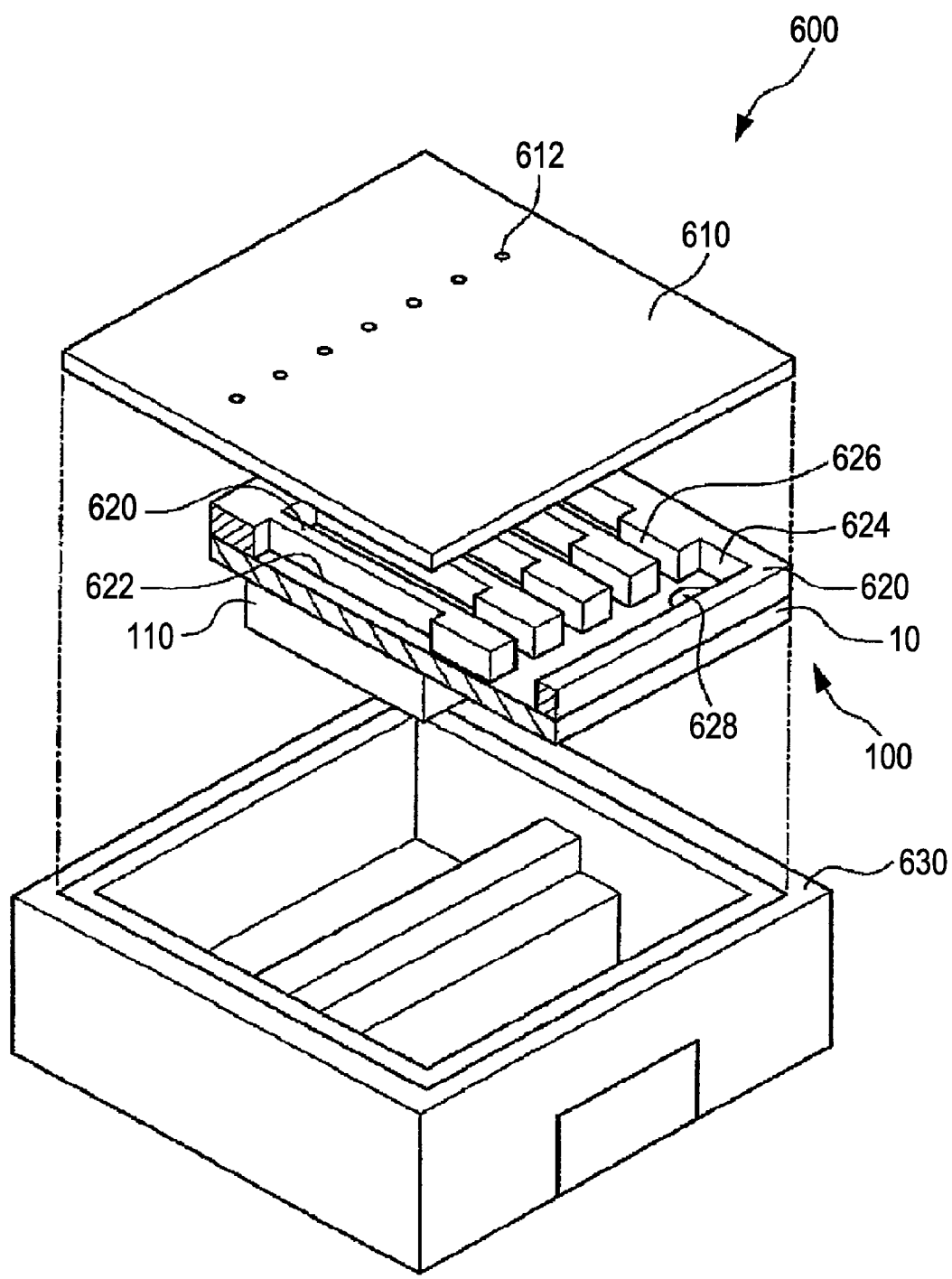
FIG. 10 is an exploded perspective view that schematically illustrates an example of the structure of the liquid ejecting head according to an exemplary embodiment of the invention.

Next, with reference to FIGS. 9 and 10, a liquid ejecting head 600 in which a piezoelectric element according to an exemplary embodiment of the invention functions as a piezoelectric actuator is explained below. FIG. 9 is a sectional view that schematically illustrates an example of the structure of an essential part of the liquid ejecting head 600. FIG. 10 is a downside-up exploded perspective view that schematically illustrates an example of the structure of the liquid ejecting head 600, which is turned upside down for the purpose of illustration. Note that the illustrated upside is actually the downside in normal use.

The liquid ejecting head 600 includes a piezoelectric element according to an exemplary embodiment of the invention or any variation example. In the following explanation, it is assumed that the liquid ejecting head 600 includes the piezoelectric element 100 according to the foregoing embodiment of the invention as an example thereof. As explained earlier, in a configuration in which the piezoelectric element 100 serves as a piezoelectric actuator, the substrate 10 may be a flexible vibrating plate that gets deformed due to the operation of the piezoelectric substance layer 30.

As illustrated in FIGS. 9 and 10, the liquid ejecting head 600 includes a nozzle plate 610 that has nozzle holes 612, a pressure chamber substrate 620 in which pressure chambers (i.e., pressure compartments) 622 are formed, and the piezoelectric elements 100 (which may be referred to as piezoelectric actuator 100). Besides the nozzle plate 610, the pressure chamber substrate 620, and the piezoelectric elements 100, the liquid ejecting head 600 includes a case 630 shown in FIG. 10. The layered structure 110 of the piezoelectric element 100 is simplified in FIG. 10.

As illustrated in FIGS. 9 and 10, the nozzle plate 610 has the plurality of nozzle holes 612. Ink droplets can be discharged from the nozzle holes 612. For example, many nozzle holes 612 are formed in a line through the nozzle plate 610. Examples of the material of the nozzle plate 610 include silicon and stainless steel (SUS).

The pressure chamber substrate 620 is provided on the nozzle plate 610 (under the nozzle plate 610 in the downside-up example of FIG. 10). An example of the material of the pressure chamber substrate 620 is silicon single crystal. The pressure chamber substrate 620 has spaces that are partitioned between the nozzle plate 610 and the substrate 10. As illustrated in FIG. 10, a reservoir (liquid retaining section) 624, supply ports 626 that are in communication with the reservoir 624, and the pressure chambers 622 each of which is in communication with the corresponding one of the supply ports 626 are formed inside the pressure chamber substrate 620 as the partitioned spaces. That is, the nozzle plate 610, the pressure chamber substrate 620, and the substrate 10 form the boundary walls of the reservoir 624, the supply ports 626, and the pressure chambers 622. A hole 628 is formed through the substrate 10. Ink is supplied from the outside (e.g., an ink cartridge) to the reservoir 624 through the through hole 628. The reservoir 624 can temporarily retain ink that is supplied thereto. The ink retained in the reservoir 624 is supplied through the supply ports 626 into the pressure chambers 622. The capacity of the pressure chamber 622 changes when the substrate 10 becomes deformed. Each of the pressure chambers 622 is in communication with the corresponding nozzle hole 612. As the capacity of the pressure chamber 622 changes, an ink droplet is discharged from the nozzle hole 612.

The piezoelectric elements 100 are provided on the pressure chamber substrate 620 (under the pressure chamber substrate 620 in the downside-up example of FIG. 10). The layered structure 110 of the piezoelectric element 100 is electrically connected to a piezoelectric element driving circuit, which is not illustrated in the drawing. The layered structure 110 can operate (vibrate, become deformed) on the basis of a signal outputted from the piezoelectric element driving circuit. The substrate 10 can become deformed as a result of the operation of the layered structure 110 (the piezoelectric substance layer 30) to instantaneously increase the internal pressure of the pressure chamber 622. Though the junction 39 where the side surface 34 of the piezoelectric substance layer 30 meets with the upper surface 12 of the substrate 10 is located outside the pressure chamber 622 in a plan view in the illustrated example of FIG. 9, it may be located inside the pressure chamber 622.

As illustrated in FIG. 10, the nozzle plate 610, the pressure chamber substrate 620, and the piezoelectric elements 100 can be encased in the case 630. Examples of the material of the case 630 include resin and metal.

As explained earlier, the liquid ejecting head 600 includes the piezoelectric element 100 that offers great reliability. Therefore, the liquid ejecting head 600 offers great reliability.

For example, the liquid ejecting head 600 is an ink jet recording head. The liquid ejecting head is not limited to an inkjet recording head. The invention can be applied to various types of a liquid ejecting head including but not limited to: a color material ejection head that is used in the production of a color filter for a liquid crystal display device or the like; an electrode material ejection head that is used for the electrode formation of an organic electroluminescence (EL) display device, a surface/plane emission display device (FED), and the like; and a living organic material ejection head that is used for production of biochips.

5. Liquid Ejecting Apparatus

Figure 11:
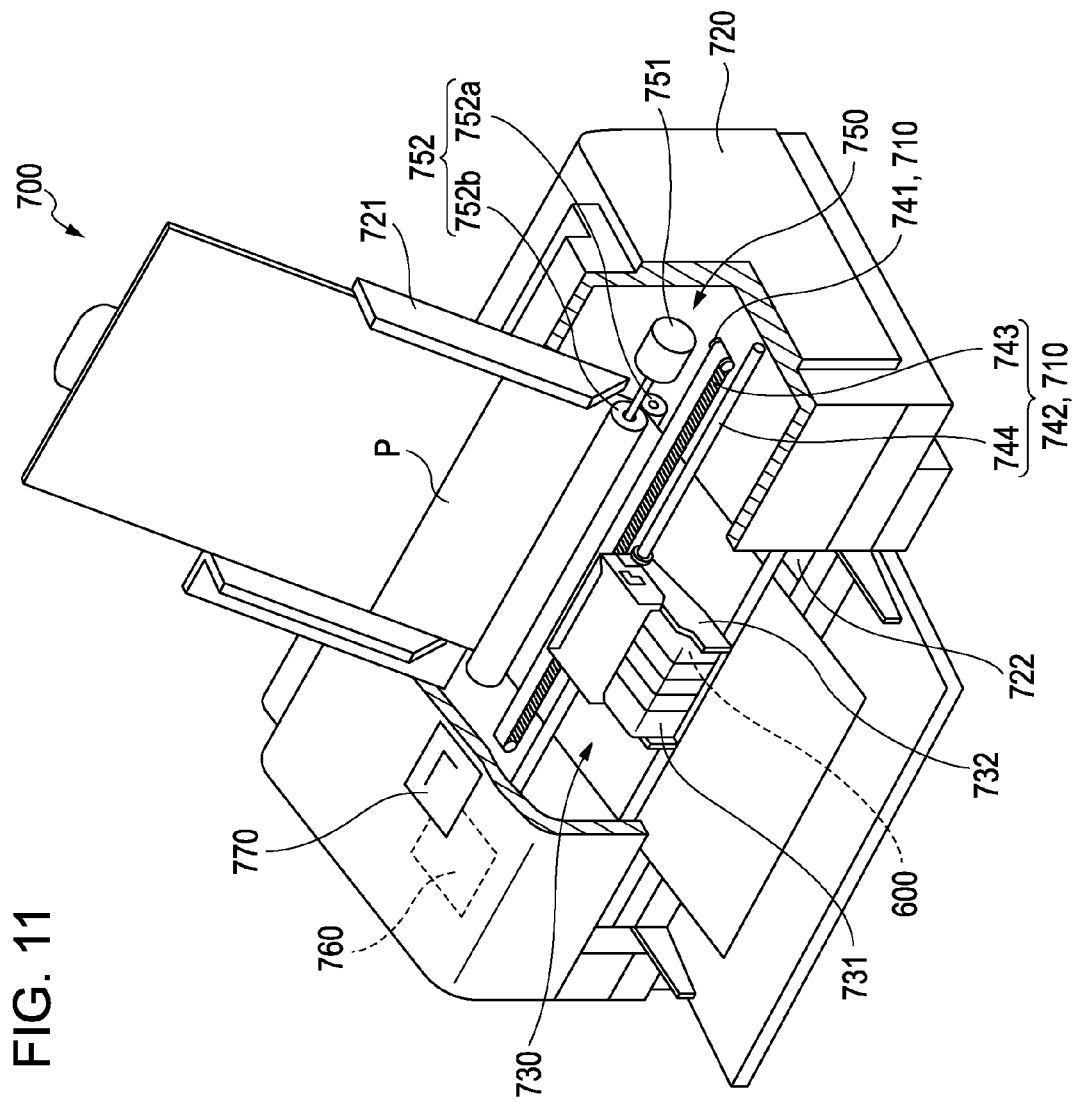
FIG. 11 is a perspective view that schematically illustrates an example of the configuration of a liquid ejecting apparatus according to an exemplary embodiment of the invention.

Next, with reference to FIG. 11, a liquid ejecting apparatus according to an exemplary embodiment of the invention is explained. FIG. 11 is a perspective view that schematically illustrates an example of the configuration of a liquid ejecting apparatus 700 according to an exemplary embodiment of the invention. The liquid ejecting apparatus 700 is equipped with a liquid ejecting head according to an exemplary embodiment of the invention. In the following explanation, an ink-jet printer is taken as an example of the liquid ejecting apparatus 700.

As illustrated in FIG. 11, the liquid ejecting apparatus 700 includes a head unit 730, a driving unit 710, and a control unit 760. The liquid ejecting apparatus 700 further includes an apparatus body 720, a paper-feed unit 750, a tray 721 on which sheets of printing paper P are placed, an ejection port through which the paper P is ejected, and an operation panel 770 that is provided at the upper surface of the apparatus body 720.

The head unit 730 is equipped with an ink jet recording head (hereinafter may be simply referred to as head), which is the liquid ejecting head 600 explained above. Besides the liquid ejecting head 600, the head unit 730 is equipped with ink cartridges 731 and a carrying unit (i.e., carriage) 732. Ink is supplied to the head from the ink cartridges 731. The head is mounted on the carrying unit 732. The ink cartridges 731 are detachably attached to the carrying unit 732.

The driving unit 710 can reciprocate the head unit 730. The driving unit 710 includes a carriage motor 741 and a reciprocation mechanism 742. The carriage motor 741 supplies power for driving the head unit 730. The reciprocation mechanism 742 causes the head unit 730 to move in a reciprocating motion.

The reciprocation mechanism 742 includes a carriage-guiding shaft 744 and a timing belt 743. A frame that is not illustrated in the drawing supports the carriage-guiding shaft 744. The timing belt 743 is stretched in parallel to the carriage-guiding shaft 744. The carriage-guiding shaft 744 supports the carrying unit 732 while allowing the carrying unit 732 to reciprocate freely. The carrying unit 732 is attached to a part of the timing belt 743. When the carriage motor 741 is driven, the timing belt 743 runs. As the timing belt 743 runs, the head unit 730 moves in a reciprocating motion along the carriage-guiding shaft 744. The head ejects ink during a time period of the reciprocation of the head unit 730. In this way, an image or the like is printed on a sheet of printing paper P.

The control unit 760 can control the head unit 730, the driving unit 710, and the paper-feed unit 750.

The paper-feed unit 750 can pick up a sheet of printing paper P from the tray 721 and feed the printing paper P toward the head unit 730. The paper-feed unit 750 includes a paper-feed motor 751 and a paper-feed roller 752. The paper-feed motor 751 supplies power for driving the paper-feed roller 752. The paper-feed roller 752 rotates when driven by the paper-feed motor 751. The paper-feed roller 752 includes a pair of rollers, that is, a driven roller 752a and a driving roller 752b. The driven roller 752a is provided as a lower roller. The driving roller 752b is provided as an upper roller. The driven roller 752a and the driving roller 752b are provided opposite to each other with a feeding path of the printing paper P being interposed between the driven roller 752a and the driving roller 752b. The driving roller 752b is connected to the paper-feed motor 751. When driven by the control unit 760, the paper-feed unit 750 feeds the printing paper P. The printing paper P passes through an area under the head unit 730.

The head unit 730, the driving unit 710, the control unit 760, and the paper-feed unit 750 are provided inside the apparatus body 720.

As explained earlier, the liquid ejecting apparatus 700 includes the liquid ejecting head 600 that offers great reliability. Therefore, the liquid ejecting apparatus 700 offers great reliability.

In the above example, an inkjet printer is taken as an example of the liquid ejecting apparatus 700. However, the liquid ejecting apparatus 700 is not limited to an inkjet printer. As another example of various applications, a liquid ejecting apparatus according to an aspect of the invention can be used as an industrial liquid discharging apparatus. Various kinds of functional materials that are dissolved in a solvent or dispersed in a dispersion medium to have moderate viscosity can be used as liquid (a liquid material) to be discharged.

The foregoing exemplary embodiment and the variation examples are shown merely for the purpose of explaining the concept of the invention. The scope of the invention is not limited to these examples. For example, the foregoing exemplary embodiment and the variation examples may be arbitrarily combined.

Although a detailed explanation is given above while describing an exemplary embodiment of the invention, a person skilled in the art can easily understand that the invention is not limited to the exemplary embodiment and the variation examples described herein and that the invention may be modified, altered, changed, adapted, and/or improved within a range not departing from the gist and/or spirit of the invention, including its novel and inventive features as well as unique advantageous effects thereof, as apprehended from explicit and implicit description made herein. Such a modification, an alteration, a change, an adaptation, and/or an improvement are also covered by the scope of the appended claims.

What is claimed is:

1. A piezoelectric element comprising:
   a substrate;
   a lower electrode that is disposed on and/or over the substrate;
   a piezoelectric substance that covers the lower electrode and comprises a substantially flat upper surface; and
   an upper electrode that is disposed on and/or over the piezoelectric substance,
   wherein a side surface of the piezoelectric substance comprises a first portion that extends from the upper surface of the piezoelectric substance and a second portion that extends from the first portion towards the substrate, the first portion is inclined at a first angle with respect to an upper surface of the substrate, the second portion is inclined at a second angle with respect to the upper surface of the substrate, the second angle is smaller than the first angle, and the upper electrode covers at least the first portion and the second portion.

2. The piezoelectric element according to claim 1, wherein the shape of each of the first portion and the second portion is a flat surface.

3. The piezoelectric element according to claim 1, wherein the side surface of the piezoelectric substance layer further comprises a third portion that extends from the second portion towards the substrate; wherein the third portion is inclined at a third angle with respect to the upper surface of the substrate; and the third angle is larger than the second angle but smaller than the first angle.

4. The piezoelectric element according to claim 1, comprising a plurality of layered structures made up of the lower electrode, the piezoelectric substance layer, and the upper electrode; wherein the lower electrode is an individual electrode in each of the plurality of layered structures; and the upper electrode is a common electrode for the plurality of layered structures.

5. A method for manufacturing a piezoelectric element, comprising:

providing a lower electrode on and/or over a substrate;

covering the lower electrode with a piezoelectric member comprising a piezoelectric substance;

providing a first upper electrode on and/or over the piezoelectric member;

patterning the first upper electrode and the piezoelectric member; and providing a second upper electrode on and/or over the first upper electrode and the piezoelectric substance layer after the patterning, wherein the patterning comprises forming a first portion of a side surface of the piezoelectric member that extends from a substantially flat upper surface of the piezoelectric member and is inclined at a first angle with respect to an upper surface of the substrate and a second portion of the side surface of the piezoelectric member that extends from the first portion towards the substrate and is inclined at a second angle with respect to the upper surface of the substrate, wherein the second angle is smaller than the first angle, and wherein providing the second upper electrode comprises covering at least the first portion and the second portion with the second upper electrode.

6. A piezoelectric actuator comprising the piezoelectric element according to claim 1, wherein the substrate is flexible and gets deformed due to operation of the piezoelectric substance layer.

7. A liquid ejecting head comprising: the piezoelectric actuator according to claim 6; and a pressure chamber that is in communication with a nozzle hole and has variable capacity that changes due to operation of the piezoelectric actuator.

8. A liquid ejecting apparatus comprising the liquid ejecting head according to claim 7.

9. A piezoelectric element comprising:

a substrate;

a lower electrode that is disposed on and/or over the substrate;

a piezoelectric substance that covers the lower electrode; and an upper electrode that is disposed on and/or over the piezoelectric substance, wherein the piezoelectric substance comprises a first portion with a substantially flat upper surface disposed along a first direction, a second portion with a first side surface extending from the upper surface in a second direction outward and toward the substrate, and a third portion with a second side surface extending from the first side surface in a third direction outward and toward the substrate, wherein the second direction intersects the substrate at a first angle and the third direction intersects the substrate at a second, smaller angle, and the upper electrode covers at least the second portion and the third portion.

10. A method for manufacturing a piezoelectric element, comprising:

providing a lower electrode on and/or over a substrate;

covering the lower electrode with a piezoelectric member comprising a piezoelectric substance;

providing a first upper electrode on and/or over the piezoelectric member;

patterning the first upper electrode and the piezoelectric member; and providing a second upper electrode on and/or over the first upper electrode and the piezoelectric substance layer after the patterning, wherein, after the patterning, the piezoelectric member comprises a first portion with a substantially flat upper surface disposed along a first direction, wherein the patterning comprises defining a second portion with a first side surface extending from the upper surface in a second direction outward and toward the substrate, and a third portion with a second side surface extending from the first side surface in a third direction outward and toward the substrate, wherein the second direction intersects the substrate at a first angle and the third direction intersects the substrate at a second, smaller angle, and wherein providing the second upper electrode comprises covering at least the second portion and the third portion with the second upper electrode.

* * * * *